US006531945B1

(12) United States Patent
Ahn et al.

(10) Patent No.: US 6,531,945 B1
(45) Date of Patent: Mar. 11, 2003

(54) INTEGRATED CIRCUIT INDUCTOR WITH A MAGNETIC CORE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/523,097

(22) Filed: Mar. 10, 2000

(51) Int. Cl.$^7$ ................................................ H01F 5/00
(52) U.S. Cl. ........................ 336/200; 336/223; 336/232; 29/602.1
(58) Field of Search ................................. 336/200, 223, 336/232; 29/206, 202.1

(56) References Cited

U.S. PATENT DOCUMENTS

| | | | | |
|---|---|---|---|---|
| 3,881,244 A | * | 5/1975 | Kendall | 29/602.1 |
| 3,918,148 A | * | 11/1975 | Magdo et al. | 29/840 |
| 3,988,764 A | | 10/1976 | Cline et al. | |
| 5,062,197 A | * | 11/1991 | Charles | 29/606 |
| 5,098,528 A | | 3/1992 | DeLalande et al. | |
| 5,227,659 A | * | 7/1993 | Hubbard | 257/531 |
| 5,392,020 A | * | 2/1995 | Chang | 336/200 |
| 5,569,626 A | * | 10/1996 | Kurtz et al. | 438/50 |
| 5,831,331 A | | 11/1998 | Lee | |
| 5,852,866 A | * | 12/1998 | Kuettner et al. | 29/608 |
| 5,861,647 A | | 1/1999 | Zhao et al. | |
| 5,863,024 A | | 1/1999 | Blind et al. | |
| 5,896,078 A | * | 4/1999 | Hayakawa et al. | 336/200 |
| 5,898,020 A | * | 4/1999 | Goyal et al. | 505/239 |
| 5,949,030 A | * | 9/1999 | Fasano et al. | 174/262 |
| 5,966,593 A | * | 10/1999 | Budnaitis et al. | 438/118 |
| 6,166,422 A | * | 12/2000 | Qian et al. | 257/531 |
| 6,249,039 B1 | * | 6/2001 | Harvey et al. | 257/531 |

FOREIGN PATENT DOCUMENTS

JP          05198440       *   8/1993

OTHER PUBLICATIONS

Ahn, A Fully Integrated Planar Toroidal Inductor with a Micromachined Nicket–Iron Magnetic Bar, Sep. 1994, IEEE Transcations on Components, Packaging, and Manufacturing Technology, Part A, vol. 17 pp. 463–469.*

MacChesney, et al. "Chemical Vapor Deposition of Iron Oxide Films for Use as Semitransparent Masks." Journal of the Electrochemical Society. May, 1971. pp. 776–781.

Shigematsu, et al. "Magnetic Properties of Amorphous Iron (III) Oxide Thin Films." Journal de Physique. Mar., 1979. pp. C2–153–154.

Domke, et al. "Magnetic and Electronic Properties of Thin Iron Oxide Films." Surface Science. Aug., 1982. pp. 727–732.

(List continued on next page.)

Primary Examiner—Anh T. Mai
(74) Attorney, Agent, or Firm—Knobbe, Martens, Olson & Bear, LLP

(57) ABSTRACT

An inductor is fabricated on a substrate having a top surface and a bottom surface. The inductor includes a plurality of holes extending through the substrate, wherein the plurality of holes interconnect the top surface and the bottom surface of the substrate. The inductor also includes a plurality of conductive posts formed in the plurality of holes and a plurality of conductive segments formed on the top surface and on the bottom surface that interconnect the conductive posts such that a continuous conductive coil is formed. The inductor also includes a magnetic core that occupies substantially the entire volume enclosed by the conductive coil.

15 Claims, 10 Drawing Sheets

OTHER PUBLICATIONS

Ouchi, et al. "High Rate Deposition of Iron–Oxide Thin Film by Reactive Sputtering." IEEE Transactions on Magnetics. Sep., 1983. pp. 1980–1982.

Kaito, et al. "Structure of Iron Oxide Films Prepared by Evaporating Various Iron Oxide Powders." Applications of Surface Science. Oct., 1984. pp. 621–630.

Lin, et al. "Properties of RF Sputtered Iron Oxide Thin Films with CoCr and Nb as Dopants." IEEE Transactions on Magnetics. Sep., 1985. pp. 1462–1464.

Joshi, et al. "Pulsed Laser Deposition of Iron Oxide and Ferrite Films." Journal of Applied Physics. Nov., 1988. pp. 5647–5649.

Li, et al. "Preparation of Amorphous Iron–containing and Crystalline Iron Oxide Films by Glow Discharge and Their Properties." Materials Science and Engineering. 1990. pp. 5–13.

Dubin, Valery M. "Formation Mechanism of Porous Silicon Layers Obtained by Anodization of Monocrystalline N–type Silicon in HF Solutions." Surface Science. Feb., 1992. pp. 82–92.

Dhara, et al. "Direct Deposition of Highly Coercive Gamma Iron Oxide Thin Films for Magnetic Recording." Journal of Applied Physics. Dec., 1993. pp. 7019–7021.

Fujii, et al. "Low–Temperature Preparation and Properties of Spinel–Type Iron Oxide Films by ECR Plasma–Enhanced Matalorganic Chemical Vapor Deposition." Japanese Journal of Applied Physics. Oct., 1993. pp. L1527–L1529.

Seki, et al. "Pressure/Photo Sensor Utilizing Polymer Magnetic Composite." IEEE Transactions on Magnetics. Nov., 1993. pp. 3189–3191.

Gokturk, et al. "Electric and Magnetic Properties of a Thermoplastic Elastomar Incorporated with Ferrromagnetic Powders." IEEE Transactions on Magnetics. Nov., 1993. pp. 4170–4176.

Itoh, et al. "Ferrite Plating of Ba–Containing Iron Oxide Films Using Chelated Highly Alkaline (pH=11–13) Aqueous Solutions." Japanese Journal of Applied Physics. Mar., 1995. pp. 1534–1536.

Craciun, et al. "On the Morphology of Porous Silicon Layers Obtained by Electrochemical Method." 1995 International Semiconductor Conference Proceedings. Oct., 1995. pp. 331–334.

Lagorce, et al. "Micromachined Polymer Magnets." IEEE Abstract. 1996. pp 85–90.

Hong, et al. "Granular Magnetic Cobalt Metal/Polymer Thin Film System." IEEE Transactions on Magnetics. Sep., 1996. pp. 4475–4477.

Savin, et al. "Properties of Laser Ablated Porous Silicon." Applied Physics Letter. Nov., 1996. pp. 3048–3050.

Wan, et al. "A Composite of Polyaniline with Both Conducting and Ferromagnetic Functions." Journal of Polymer Science. 1997. pp. 2129–2136.

Vadera, et al. "Preparation and Study of Finely Dispersed Magnetic Oxide in Polymer Matrix." Journal de Physique IV. Mar., 1997. pp. C1–549–C1–550.

Kim, et al. "Surface Micromachined Solenoid Inductors for High Frequency Applications." 1997 International Symposium on Microelectronics Proceedings. pp. 1–8.

Ouyang, et al. "Structure and Magnetic Properties of Iron Oxide Films Deposited by Excimer Laser Ablation of a Metal–Containing Polymer." Materials Research Bulletin. 1997. pp. 1099–1107.

Baba, et al. "Ferromagnetic Particle Composite Polymer Films for Glass and Semiconductor Substrates." Optics Communications. Jun., 1997. pp. 35–38.

Liu, et al. "Layer–by–Layer electrostatic Self–assembly of Nanoscale $Fe_3O_4$ Particles and Polyimide Precursor on Silicon and Silica Surfaces." Applied Physics Letter. Oct., 1997. pp. 2265–2267.

Nam, et al. "High–Performance Planar Inductor on Thick Oxidized Porous Silicon (OPS) Substrate." IEEE Microwave and Guided Wave Letters. Aug., 1997. pp. 236–238.

Park, et al. "Ferrite–based Integrated Planar Inductors and Transformers Fabricated at Low Temperature." IEEE Transactions on Magnetics. Sep., 1997. pp. 3322–3324.

Soh, et al. "Ultra–low Resistance, Through–Wafer VIA (TWV) Technology and Its Applications in Three Dimensional Structures on Silicon." 1998 International Conference on Solid State Devices and Materials Proceedings. pp. 284–285.

Park, et al. "Fully Integrated Micromachined Inductors with Electroplated Anisotropic Magnet Cores." 1998 Applied Power Electronics Conference and Exposition Proceedings. pp. 379–385.

Namkung, et al. "Effects of Heat Treatment on the Magnetic Properties of Polymer–bound Iron Particle Cores." Journal of Applied Physics. Jun., 1998. pp. 6474–6476.

Dimitrov, et al. "Stoichiometry and Magnetic Properties of Iron Oxide Films." 1997 Fall MRS Symposium Proceedings. pp. 89–94.

\* cited by examiner

INTEGRATED CIRCUIT INDUCTOR WITH A MAGNETIC CORE

BACKGROUND OF THE INVENTION

1. Field of the Invention

This invention relates in general to inductors for use in integrated circuits, and relates more particularly to integrated circuit inductors having magnetic cores.

2. Description of the Related Art

Inductors are used in a wide range of signal processing systems and circuits. For example, inductors are used in communication systems, radar systems, television systems, high pass filters, tank circuits, and butterworth filters.

As electronic signal processing systems have become more highly integrated and miniaturized, system designers have sought to eliminate the use of relatively large auxiliary components, such as inductors. One approach to eliminating the use of actual inductors in signal processing systems is to simulate inductors using active circuits, which can be easily miniaturized. Unfortunately, simulated inductor circuits tend to exhibit large parasitic effects and often generate more noise than circuits constructed using actual inductors.

When unable to eliminate inductors in their designs, designers have sought ways to reduce the size of the inductors that are used. For example, inductors are miniaturized for use in compact communication systems, such as cellular phones and modems. These miniaturized inductors typically comprise two-dimensional spiral inductors that are fabricated on the same substrates as the integrated circuits to which they are coupled. Although these two-dimensional spiral inductors can be fabricated using conventional integrated circuit manufacturing techniques, they typically take up a disproportionately large share of the available surface area on an integrated circuit substrate.

For these and other reasons, there is a need for the present invention.

SUMMARY OF THE INVENTION

An inductor comprises a substrate, a magnetic core formed in a region of the substrate, and a conductive coil interwoven with the substrate and surrounding the magnetic core.

In one embodiment, an inductor comprises a substrate, a magnetic core formed on the substrate, and a three-dimensional conductive coil. The conductive coil comprises a plurality of conductive posts interconnected by a plurality of conductive segments such that the conductive coil surrounds the magnetic core.

In one embodiment, an inductor comprises a substrate comprising a semiconductor having a crystalline structure, a magnetic core formed on the substrate, a plurality of paths extending through the substrate, and a conductive coil woven through the plurality of paths and surrounding the magnetic core. The conductive coil is at least partially diffused into the crystalline structure.

In one embodiment, a device comprises a substrate and an inductive structure having an inductance of at least 1 nanohenry (nH). The inductive structure includes a magnetic core and is at least partially embedded in the substrate.

In one embodiment, an inductor comprises a substrate, a magnetic core formed on the substrate, a pair of substantially parallel rows of conductive posts providing a plurality of conductive paths through the substrate, and a plurality of conductive segments interconnecting the pair of substantially parallel rows of conductive columns to form a conductive coil surrounding the magnetic core.

In one embodiment, an inductor comprises a perforated substrate, a magnetic core formed on the perforated substrate, and a conductive material interwoven with the perforated substrate and surrounding the magnetic core. The conductive material is at least partially diffused into the perforated substrate.

In one embodiment, an inductor comprises a substrate having a top surface and a bottom surface, a plurality of holes extending through the substrate, wherein the plurality of holes interconnect the top surface and the bottom surface. The inductor further comprises a plurality of conductive posts formed in the plurality of holes, a plurality of conductive segments formed on the top surface and on the bottom surface that interconnect the conductive posts such that a continuous conductive coil is formed; and a magnetic core occupying substantially the entire volume enclosed by the conductive coil.

In one embodiment, an inductor comprises a multilayer substrate, a magnetic core formed on the multilayer substrate, and a coil interwoven with the multilayer substrate and surrounding the magnetic core.

In one embodiment, a device comprises an integrated circuit formed on a substrate, a magnetic core formed on the substrate, and an inductor interwoven with the substrate and surrounding the magnetic core, wherein the inductor is operably coupled to the integrated circuit.

In one embodiment, a memory system comprises a substrate having a plurality of memory circuits, a magnetic core formed in a region of the substrate, and a conductive coil interwoven with the substrate and surrounding the magnetic core.

In one embodiment, a computer system comprises a processor and an inductor comprising a substrate, a magnetic core formed on the substrate, and a conductive coil interwoven with the substrate and surrounding the magnetic core. The computer system further comprises an electronic device coupled to the inductor and to the processor.

In one embodiment, a method of fabricating an inductor embedded in a substrate comprises the steps of forming a magnetic core in the substrate and fabricating a three-dimensional conductive coil around the magnetic core.

In one embodiment, a method of fabricating an inductor embedded in a substrate comprises the steps of forming a plurality of paths extending through the substrate, forming a magnetic core in the substrate, depositing a conductive material in the paths to form a plurality of conductive posts, and fabricating a plurality of conductive segments that interconnect the conductive posts to form a conductive coil.

DETAILED DESCRIPTION OF THE PREFERRED EMBODIMENTS

Figure 1A:
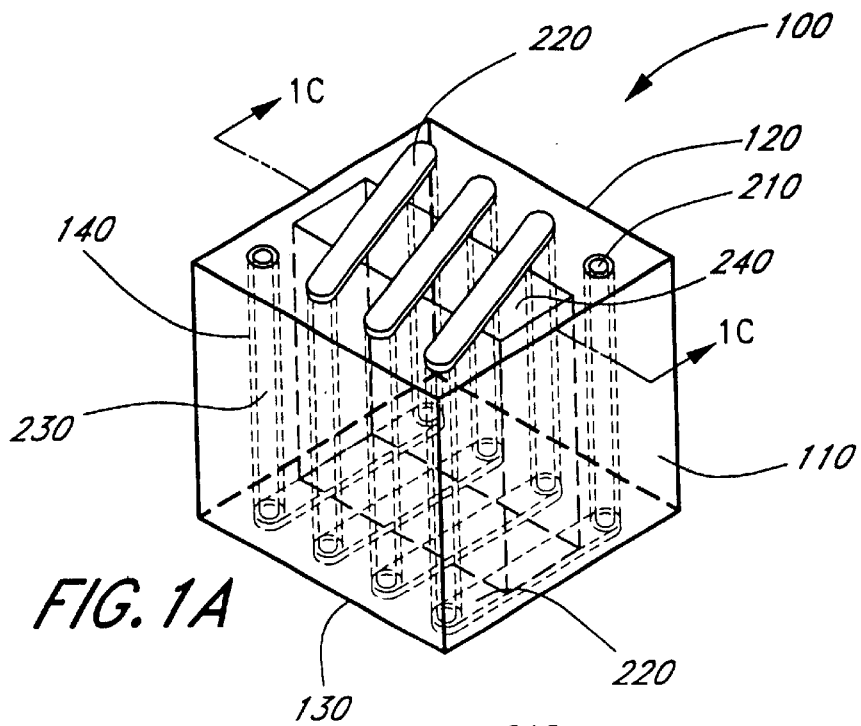
FIGS. 1A–1C illustrate an embodiment of an inductor in accordance with the present invention.
Figure 1B:
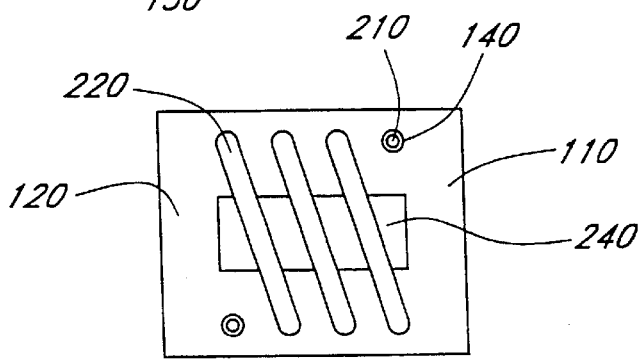
Figure 1C:
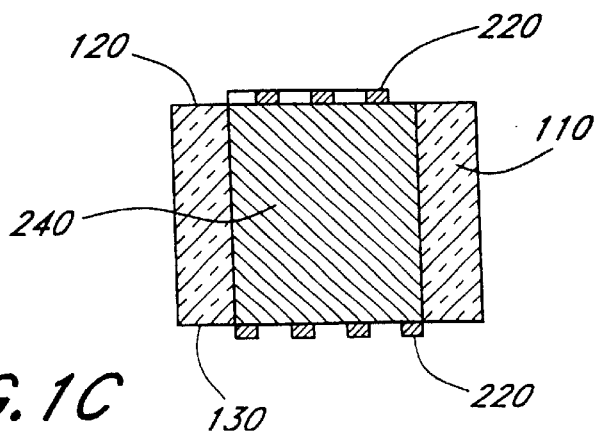
Figure 2A:
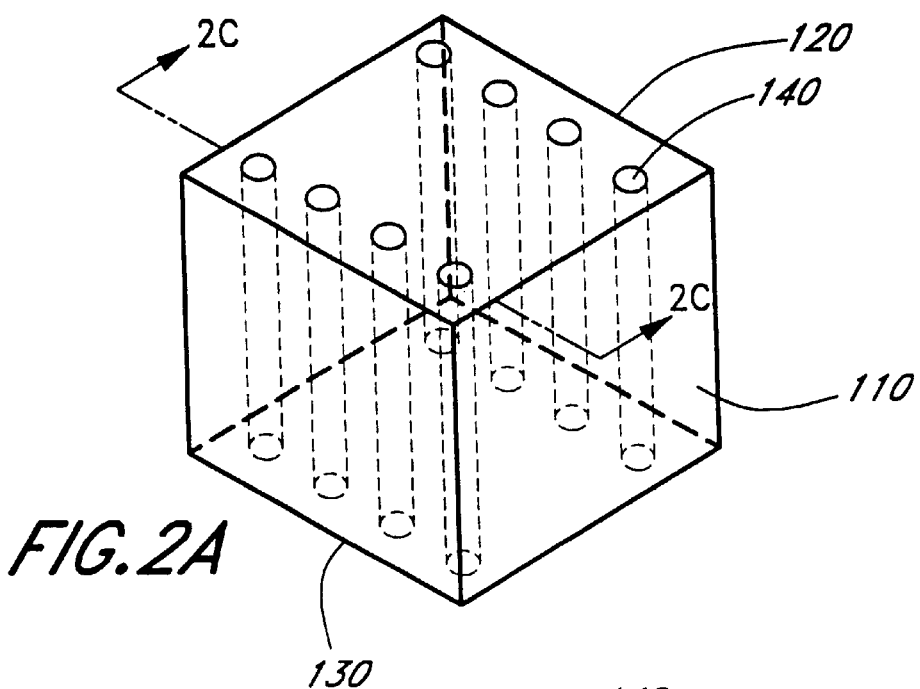
FIGS. 2A–2C illustrate a substrate with a plurality of paths extending through the substrate.
Figure 2B:
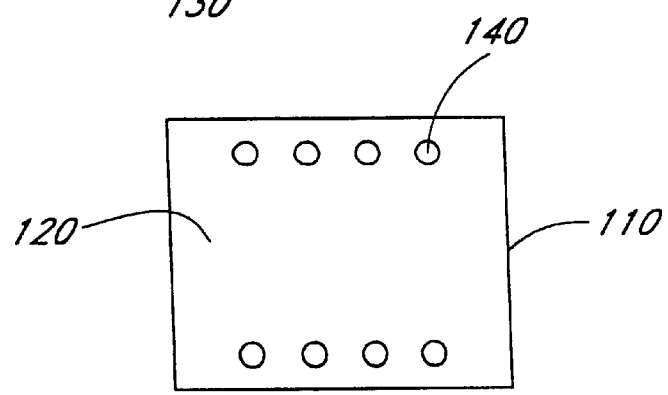
Figure 2C:
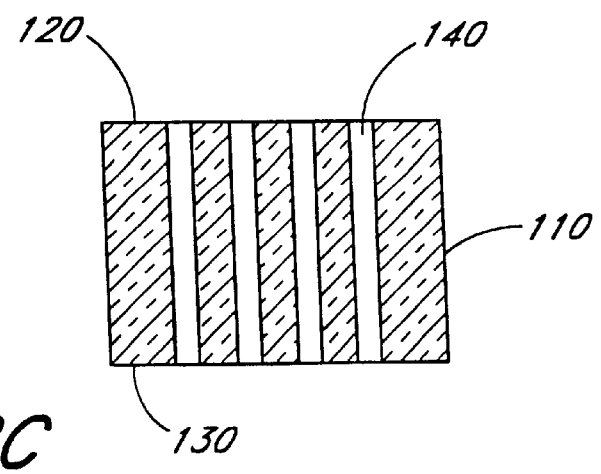

FIG. 1A illustrates an isometric view of an embodiment of an inductor 100 in accordance with the present invention. FIG. 1B illustrates a top view of the inductor 100 shown in FIG. 1A. FIG. 1C illustrates a cross-sectional view of the inductor 100 along the line 1C—1C shown in FIG. 1A. In the illustrated embodiment, the inductor 100 is fabricated on a substrate 110. In one embodiment, the substrate 110 is fabricated from a crystalline material. In an alternative embodiment, the substrate 110 is fabricated from a single-element doped or undoped semiconductor material, such as silicon or germanium. In further embodiments, the substrate 110 is fabricated from gallium arsenide, from silicon carbide, or from a partially magnetic material having a crystalline or amorphous structure.

Those of ordinary skill in the art will understand that the substrate 110 is not limited to a single layer substrate. Multiple layer substrates, coated or partially coated substrates, and substrates having a plurality of coated surfaces are all suitable for use in connection with the present invention. Suitable coatings may include insulators, ferromagnetic materials, and magnetic oxides. Insulators protect the inductive coil and separate the electrically conductive inductive coil from other conductors, such as signal carrying circuit lines. Coatings and films of ferromagnetic materials, such as magnetic metals, alloys, and oxides, increase the inductance of the inductor 100.

In addition, those of ordinary skill in the art will understand that the substrate 110 may be the fabrication site for a wide variety of integrated circuits and circuit components in addition to the inductor 100. In one embodiment, for example, the substrate 110 is the fabrication site for the inductor 100 and for a Dynamic Random Access Memory (DRAM) circuit.

In another embodiment, the substrate 110 comprises a package, such as a ceramic package, for an electronic device. This embodiment allows circuits to be designed with off-chip inductors in accordance with the present invention. By fabricating off-chip inductors in accordance with the present invention, the fabrication cost of the inductors is advantageously reduced.

In FIGS. 1A–1C, the substrate 110 has a top surface 120 and a bottom surface 130. Those of ordinary skill in the art will understand that the top surface 120 and the bottom surface 130 are not limited to oblique surfaces. In one embodiment, the top surface 120 and the bottom surface 130 are substantially parallel to one another. Because many integrated circuit manufacturing processes are designed to work with substrates having a pair of relatively flat parallel surfaces, the use of parallel surfaces may simplify the manufacturing process for forming the inductor 100.

The substrate 110 has a plurality of paths 140 extending through the substrate 110. The paths 140 interconnect the top surface 120 and the bottom surface 130 of the substrate 110. The paths 140 can advantageously comprise holes, vias, perforations, or any other suitable paths that can be filled, plugged, partially filed, partially plugged, or lined with a conducting material. In one embodiment, the plurality of paths 140 are substantially parallel to each other and are substantially perpendicular to the top surface 120 and to the bottom surface 130 of the substrate 110.

In FIGS. 1A–1C, the paths 140 are filled by a plurality of conductive posts 210. The conductive posts 210 are conductively interconnected by a plurality of conductive segments 220 located on the top surface 120 and on the bottom surface 130 of the substrate 110. The conductive posts 210 and the conductive segments 220 are interconnected to form a three-dimensional conductive coil 230, which is interwoven with the substrate 110. Thus, the inductor 100 is at least partially embedded in the substrate 110. Those of ordinary skill in the art will understand that the cross-sectional profile of the conductive posts 210 or of the conductive segments 220 is not limited to any particular shape. For example, rectangular, square, circular, and triangular shapes are all suitable for use in connection with the present invention.

In the illustrated embodiment, the conductive posts 210 are configured in two substantially parallel rows. The rows are interconnected by the plurality of conductive segments 220 to form a plurality of loops. Those of ordinary skill in the art will understand that the shape of each loop in the conductive coil 230 is not limited to any particular geometric shape. For example, rectangular, square, and triangular loops are all suitable for use in connection with the present invention.

The conductive coil 230 surrounds a magnetic core 240 and is capable of producing a reinforcing magnetic field or flux in the volume occupied by the magnetic core 240. In a preferred embodiment, the magnetic core 240 occupies substantially the entire volume enclosed by the conductive coil 230. By forming the magnetic core 240 in substantially the entire volume enclosed by the conductive coil 230, the inductance value of the inductor 100 is advantageously increased. In one embodiment, for example, the inductor 100 preferably has an inductance value in the range of about 10 nanohenries (nH) to about 100 microhenries ($\mu$H), more preferably in the range of about 10 nH to about 100 nH.

FIGS. 2–9 illustrate the step-by-step formation of the inductor 100 shown in FIGS. 1A–1C using two alternative methods. FIG. 2A illustrates an isometric view of one embodiment of the substrate 110 with a plurality of paths 140 extending through the substrate 110. FIG. 2B illustrates a top view of the substrate 110 shown in FIG. 2A. FIG. 2C illustrates a cross-sectional view of the inductor 100 along the line 2C—2C shown in FIG. 2A. The paths 140 interconnect the top surface 120 and the bottom surface 130 of the substrate 110. The distance between the top surface 120 and the bottom surface 130 of the substrate 110 is typically in the range of about 700 micrometers ($\mu$m) to about 800 $\mu$m. Therefore, the paths 140 typically have a length in the range of about 700 $\mu$m to about 800 $\mu$m.

Those of ordinary skill in the art will understand that the paths 140 can be formed using a variety of suitable processes. For example, in a preferred embodiment, the paths 140 are formed using any of a number of well-known etching processes. In other embodiments, a laser or a diamond-tipped carbide drill is used to create the paths 140.

Furthermore, those of ordinary skill in the art will understand that the shape of the paths 140 is not limited to any particular shape. For example, circular, square, rectangular, and triangular shapes are all suitable for use in connection with the present invention.

In one embodiment, the inside of the paths 140 is lined or partially lined with an electrically insulating layer (not shown). The insulating layer may comprise a variety of suitable nonconductive materials, such as, for example, polyimide, a dielectric, or an inorganic oxide, such as silicon dioxide or silicon nitride. The purpose of the insulating layer is to electrically isolate the conductive posts 210 from the magnetic core 240 when these components are formed.

Figure 3A:
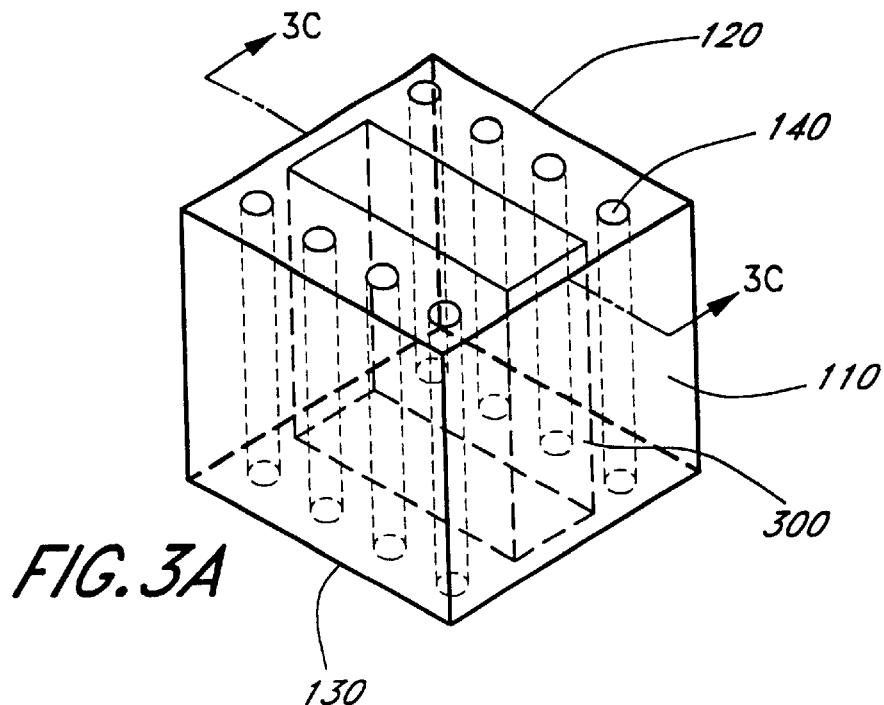
FIGS. 3A–3C illustrate the substrate of FIGS. 2A–2C after a region of the substrate has been treated to form a porous region.
Figure 3B:
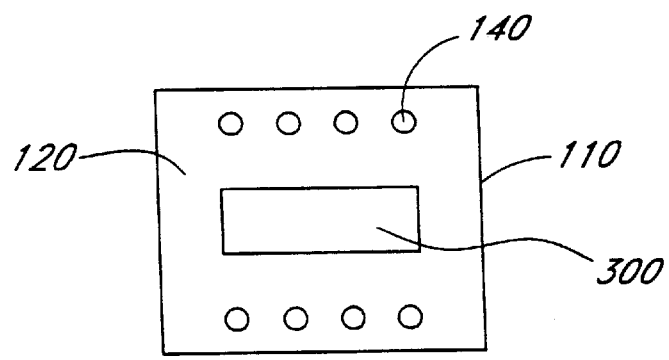
Figure 3C:
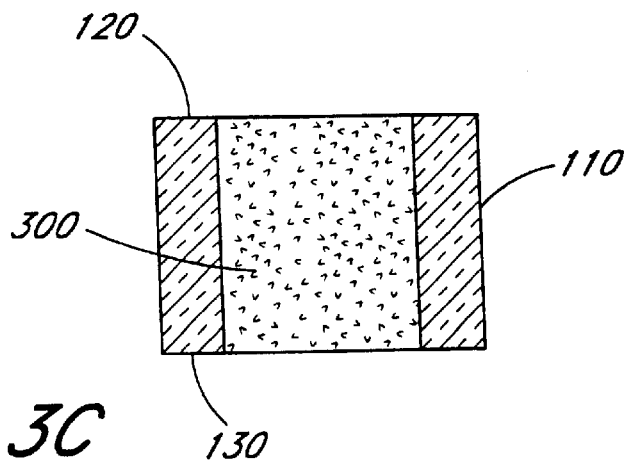

FIGS. 3–5 illustrate the step-by-step formation of the inductor 100 shown in FIGS. 1A–1C using a first exemplary process. Specifically, FIG. 3A illustrates an isometric view of the substrate 110 shown in FIGS. 2A–2C after a region of the substrate 110 has been treated to form a porous region 300. FIG. 3B illustrates a top view of the substrate 110 shown in FIG. 3A. FIG. 3C illustrates a cross-sectional view of the substrate 110 along the line 3C—3C shown in FIG. 3A. The location of the porous region 300 is selected such that the porous region 300 occupies the volume that will be enclosed by the conductive coil 230 when it is fully formed, as described in more detail below. A designer can designate the area on the substrate 110 in which the porous region 300 will be formed using conventional photolithography and masking processes.

Once the area for the porous region 300 has been designated, those of ordinary skill in the art will understand that the porous region 300 can be formed using a variety of suitable processes. For example, in one embodiment, the porous region 300 may be formed using a well-known anodic etching process. In another embodiment, the porous region 300 may be formed using a well-known laser ablation process.

In a preferred embodiment, the porous region 300 penetrates substantially the entire thickness of the substrate 110. This configuration advantageously allows substantially the entire volume enclosed by the conductive coil 230 to form the magnetic core 240 when the inductor 100 is fully fabricated. As discussed above, by forming the magnetic core 240 in substantially the entire volume enclosed by the conductive coil 230, the inductance value of the inductor 100 is advantageously increased.

Figure 4A:
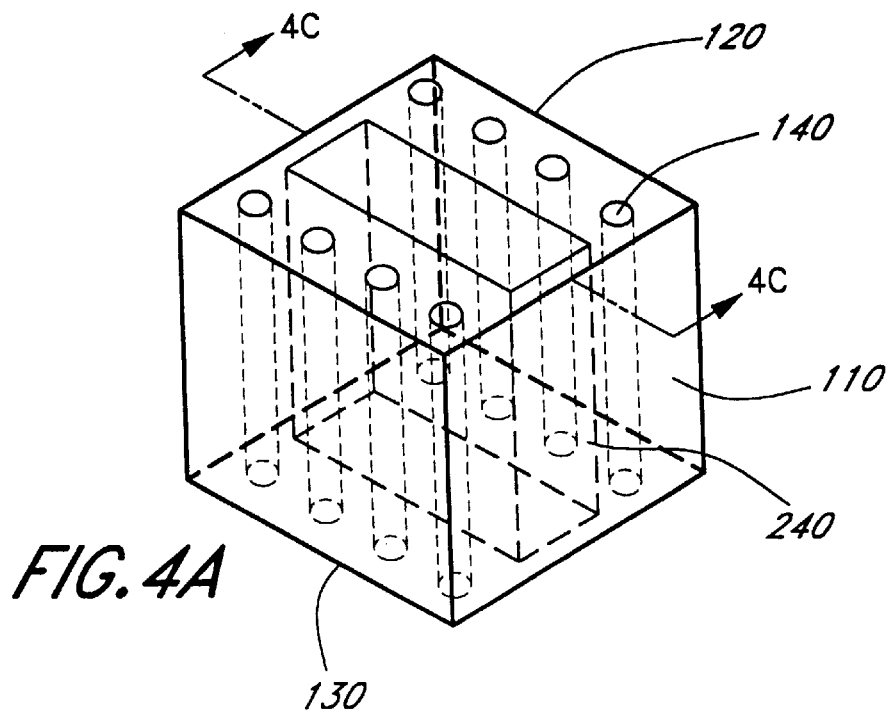
FIGS. 4A–4C illustrate the substrate of FIGS. 3A–3C after the porous region has been treated with a ferromagnetic material to form a magnetic core.
Figure 4B:
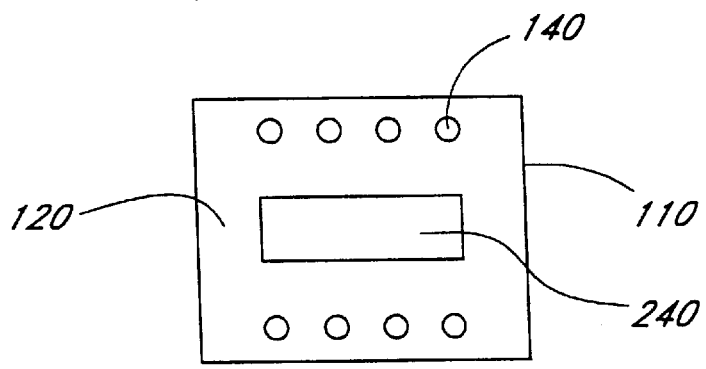
Figure 4C:
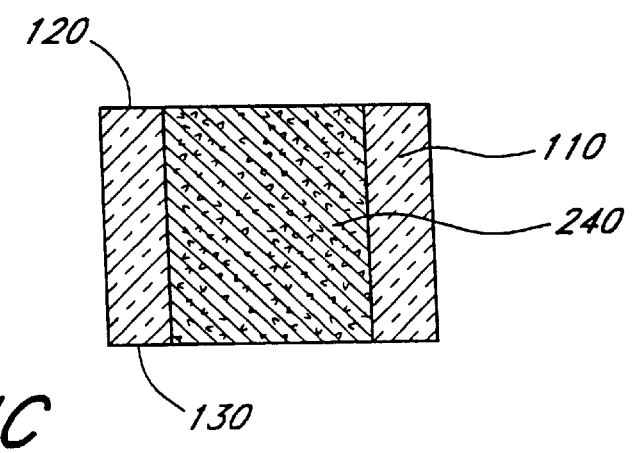

FIG. 4A illustrates an isometric view of the substrate 110 shown in FIGS. 3A–3C after a ferromagnetic material has been deposited in the porous region 300 to form the magnetic core 240. FIG. 4B illustrates a top view of the substrate 110 shown in FIG. 4A. FIG. 4C illustrates a cross-sectional view of the substrate 110 along the line 4C—4C shown in FIG. 4A. Those of ordinary skill in the art will understand that a variety of ferromagnetic materials can be used to form the magnetic core 240. For example, in one embodiment, a material comprising Permalloy having about 81% nickel (Ni) and about 19% iron (Fe) is deposited in the porous region 300 of the substrate 110. The magnetic material used to form the magnetic core 240 affects the inductance of the inductor 100 when it is fully fabricated. Thus, the particular magnetic material used to form the magnetic core 240 may advantageously be selected based on the desired inductance value.

In addition, those of ordinary skill in the art will understand that the ferromagnetic material can be deposited in the porous region 300 using a variety of suitable methods. For example, in one embodiment, the ferromagnetic material is deposited in the porous region 300 using a well-known chemical vapor deposition (CVD) process. In other embodiments, the ferromagnetic material is deposited in the porous region 300 using well-known evaporation, sputtering, laser ablation, or electrochemical deposition processes. The particular method used to deposit the ferromagnetic material in the porous region 300 may advantageously be selected based upon available deposition equipment.

In one embodiment, the ferromagnetic material is deposited in the porous region 300 using a CVD process by exposing the porous region 300 to iron pentacarbonyl vapor in an oxidizing atmosphere. In light of the present disclosure, those of ordinary skill in the art can readily determine suitable CVD parameters to achieve the desired ferromagnetic material composition in a given reactor configuration. For example, in one configuration, the iron pentacarbonyl vapor is decomposed at a temperature in the range of about 140° C. to about 200° C., and a deposition rate in the range of about 600 Å/minute to about 1400 Å/minute with an $O_2$ flow rate of about 60 standard cubic centimeters per minute (sccm) and an Ar flow rate in the range of about 40 sccm to about 60 sccm.

In another embodiment, the ferromagnetic material comprises a gamma iron oxide film, which is deposited in the porous region 300 using a chemical vapor pyrolysis process. If the temperature in the chemical vapor pyrolysis reactor exceeds 500° C., then the gamma oxide film formed in the porous region 300 exhibits magnetic properties. Otherwise, the gamma oxide film formed in the porous region 300 does not exhibit magnetic properties.

In another embodiment, the ferromagnetic material comprises a spinel-type iron oxide film, which can be deposited at low temperature by ECR plasma-enhanced metalorganic chemical vapor deposition (MOCVD). The spinel-type iron oxide film formed in the porous region 300 advantageously exhibits nearly isotropic magnetic properties.

In another embodiment, the ferromagnetic material comprises an amorphous iron oxide film. The film can be formed in the porous region 300 by depositing iron in an oxygen atmosphere by evaporation. A ferrous oxide (FeO) powder is evaporated in a vacuum containing oxygen and having a pressure in the range of about $10^{-5}$ torr to about $10^{-4}$ torr.

In another embodiment, the ferromagnetic material is deposited in the porous region 300 using a reactive sputtering process. An iron (Fe) target is sputtered onto the porous region 300 in an atmosphere containing oxygen and a substantially inert gas, such as argon (Ar), at a high deposition rate, such as a rate that is about ten times higher than the typical deposition rate. The sputtering process creates an alpha iron oxide film, which is converted to a magnetic gamma type by reducing the film in an atmosphere containing hydrogen.

In another embodiment, the ferromagnetic material is deposited in the porous region 300 using a direct sputtering process. Hot-pressed cobalt (Co) and titanium-doped ferrous oxide ($Fe_3O_4$) are used as the target in a sputtering reactor.

In another embodiment, the ferromagnetic material comprises gamma iron oxide films, which are deposited in the porous region 300 using an RF glow discharge process with iron pentacarbonyl vapor. In this embodiment, the gamma iron oxide films are formed by introducing either oxygen or carbon dioxide with iron pentacarbonyl into a glow discharge reactor at temperature above about 200° C. This process creates amorphous iron-containing and crystalline iron oxide films having a particle size less than about 0.1 $\mu$m.

In another embodiment, the ferromagnetic material comprises iron oxide and ferrite films, which are deposited in the porous region 300 using a pulsed ruby laser evaporation process. The properties of the films are affected by the substrate temperature and oxygen partial pressure during deposition. Thus, the properties of the films can advantageously be controlled by adjusting the substrate temperature and oxygen partial pressure during deposition.

In another embodiment, the ferromagnetic material comprises iron oxide films, which are deposited in the porous region 300 using the plume generated by the excimer laser ablation of polyferric methacrylate, a metal-containing polymer. The iron oxide films deposited using this process comprise iron-rich $Fe_3O_4$ and alpha $Fe_2O_3$.

In another embodiment, the ferromagnetic material comprises $Fe_2O_3$ and Ba-containing iron oxide films, which are deposited in the porous region 300 by ferrite plating with chelated high-alkaline aqueous solutions. The $Fe_2O_3$ and Ba-containing iron oxide films are formed from chelated high-alkaline aqueous solutions by ferrite plating on the substrate 110, which is heated by lamp beams. The solubility limit of the Ba-containing iron oxide films is about Ba/Fe= 0.16.

Figure 5A:
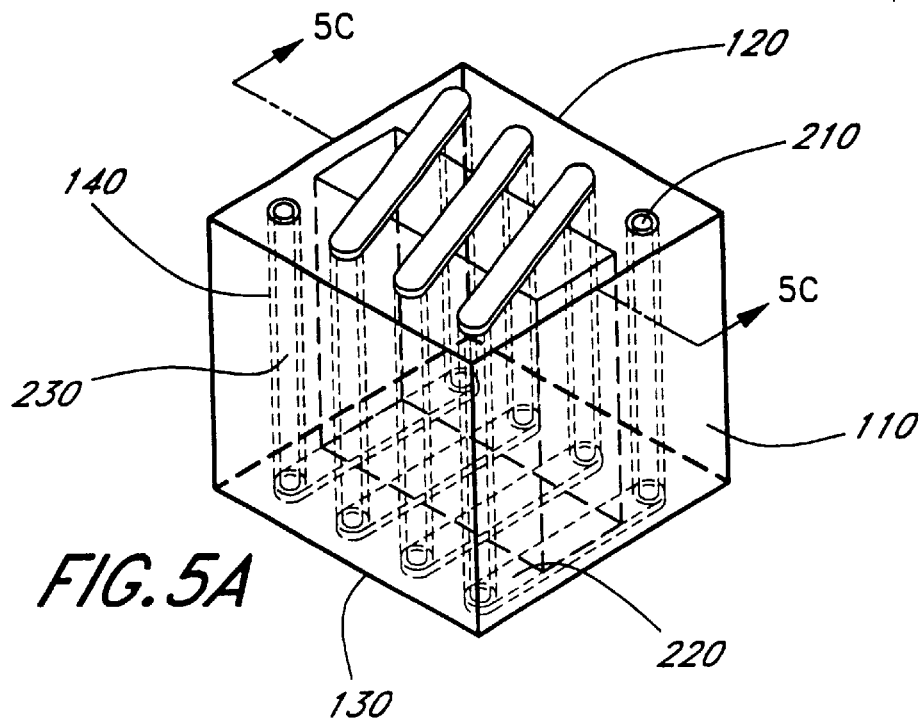
FIGS. 5A–5C illustrate the substrate of FIGS. 4A–4C after the paths have been filled with a conductive material and interconnected to form a conductive coil.
Figure 5B:
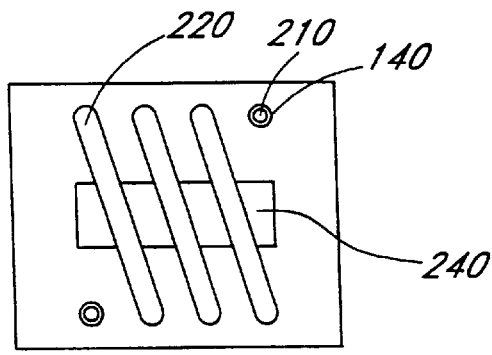
Figure 5C:
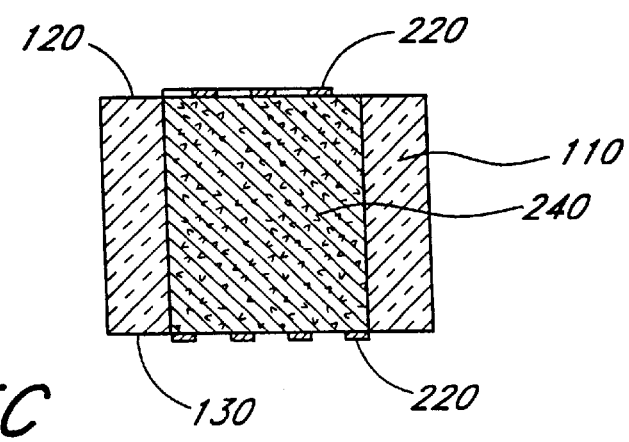

FIG. 5A illustrates an isometric view of the substrate 110 shown in FIGS. 4A–4C after the conductive posts 210 and the conductive segments 220 have been fabricated and interconnected to form the conductive coil 230. FIG. 5B illustrates a top view of the substrate 110 shown in FIG. 5A. FIG. 5C illustrates a cross-sectional view of the substrate 110 along the line 5C—5C shown in FIG. 5A. Those of ordinary skill in the art will understand that the conductive posts 210 and the conductive segments 220 can be fabricated from a wide variety of suitable conductive materials, such as metals (e.g., aluminum, copper, gold, and the like), alloys, doped polysilicon, metal suicides, and the like. In general, materials having a higher conductivity are preferred to materials having a lower conductivity.

In one embodiment, the conductive material is used to fill or partially fill the paths 140 to form the plurality of conductive posts 210. In an alternative embodiment, the conductive coil 230 is partially diffused into the substrate 110.

In one embodiment, each conductive post 210 and conductive segment 220 is fabricated from a different conductive material. This configuration is particularly advantageous because the properties of the conductive coil 230 can be easily tuned through the selection of the various conductive materials. For example, the internal resistance of the conductive coil 230 can be increased by selecting a material having a higher resistance for a particular conductive segment 220 than the average resistance in the rest of the conductive coil 230.

In an alternate embodiment, two different conductive materials are selected for fabricating the conductive coil 230. In this embodiment, materials are selected based on their compatibility with the available integrated circuit manufacturing processes. For example, if it is difficult to create a barrier layer where the conductive coil 230 pierces the substrate 110, then the conductive posts 210 that pierce the substrate 110 can be fabricated from aluminum. On the other hand, if it is relatively easy to create a barrier layer for the conductive segments 220 that interconnect the conductive posts 210, then copper can be used for the conductive segments 220.

FIGS. 6–9 illustrate the step-by-step formation of the inductor 100 shown in FIGS. 1A–1C using a second exemplary method. Specifically, FIG. 6A illustrates an isometric view of the substrate 110 shown in FIGS. 2A–2C after a cavity 400 has been formed in a region of the substrate 110. FIG. 6B illustrates a top view of the substrate 110 shown in FIG. 6A. FIG. 6C illustrates a cross-sectional view of the substrate 110 along the line 6C—6C shown in FIG. 6A. The location of the cavity 400 is selected such that the cavity 400 occupies the volume that will be enclosed by the conductive coil 230 when it is fully formed, as described in more detail below. A designer can designate the area on the substrate 110 in which the cavity 400 will be formed using conventional photolithography and masking processes.

Once the area for the cavity 400 has been designated, those of ordinary skill in the art will understand that the cavity 400 can be formed using a variety of suitable processes. For example, the cavity 400 may be formed using any of a number of well-known etching processes.

In a preferred embodiment, the cavity 400 is formed such that a layer 410 of the substrate 110 remains under the cavity 400. Preferably, the layer 410 has a thickness in the range of about 20 $\mu$m to about 30 $\mu$m. As discussed above, the substrate typically has a thickness in the range of about 700 $\mu$m to about 800 $\mu$m. Thus, the cavity 400 penetrates substantially the entire thickness of the substrate 110. This configuration advantageously allows substantially the entire volume enclosed by the conductive coil 230 to form the magnetic core 240 when the inductor 100 is fully fabricated. As discussed above, by forming the magnetic core 240 in substantially the entire volume enclosed by the conductive coil 230, the inductance value of the inductor 100 is advantageously increased.

Figure 6A:
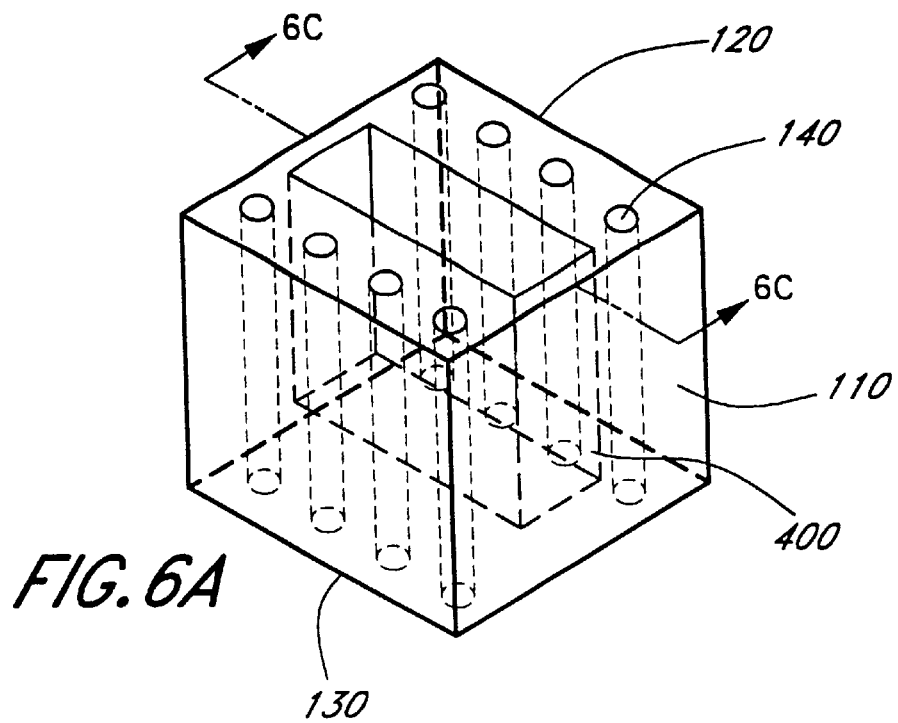
FIGS. 6A–6C illustrate the substrate of FIGS. 2A–2C after a cavity has been formed in a region of the substrate.
Figure 6B:
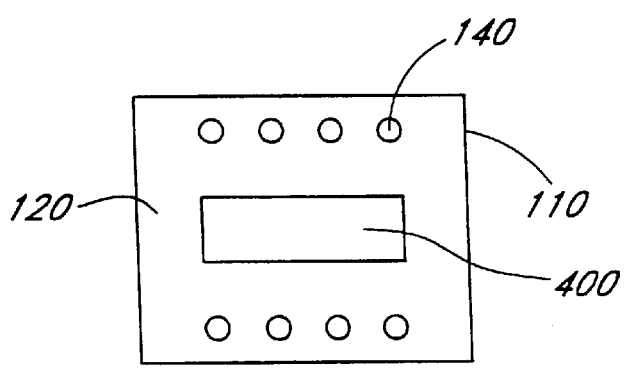
Figure 6C:
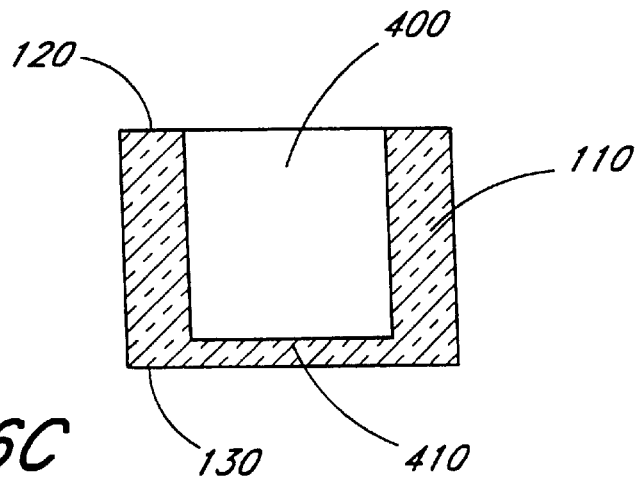
Figure 7A:
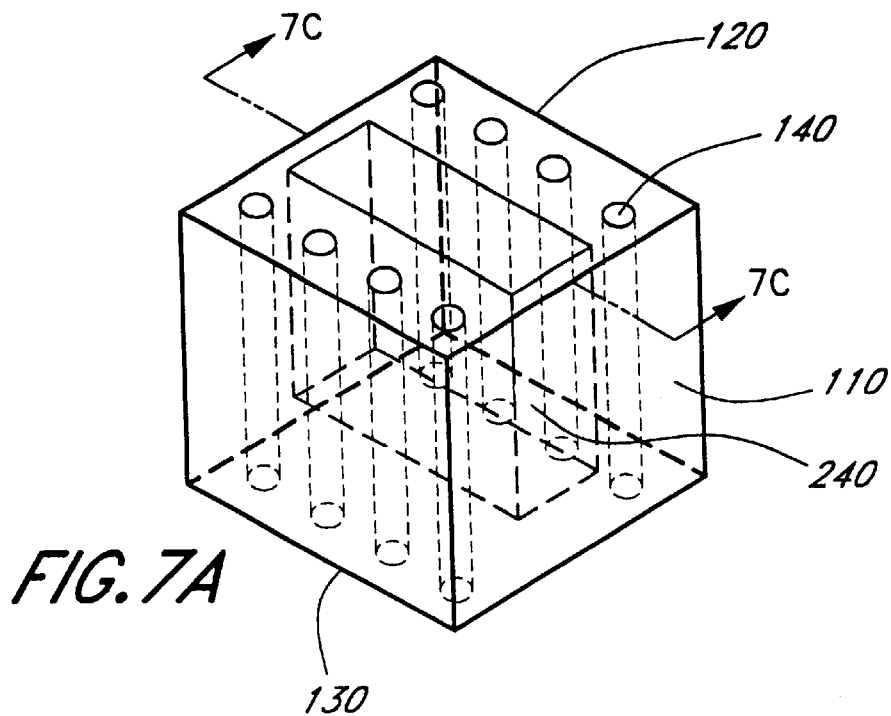
FIGS. 7A–7C illustrate the substrate of FIGS. 6A–6C after the cavity has been filled with a ferromagnetic material to form a magnetic core.
Figure 7B:
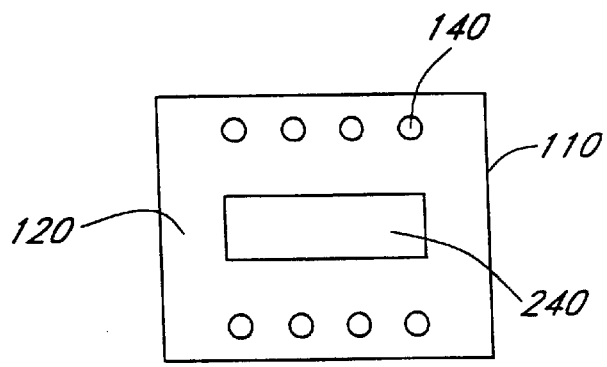
Figure 7C:
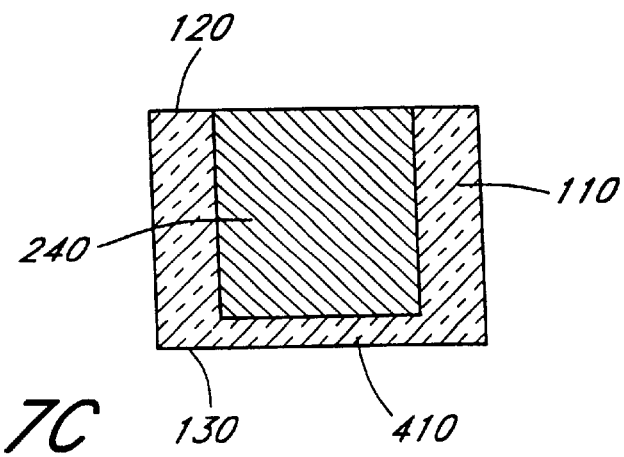

FIG. 7A illustrates an isometric view of the substrate 110 shown in FIGS. 6A–6C after a ferromagnetic material has been deposited in the cavity 400 to form the magnetic core 240. FIG. 7B illustrates a top view of the substrate 110 shown in FIG. 7A. FIG. 7C illustrates a cross-sectional view of the substrate 110 along the line 7C—7C shown in FIG. 7A. Those of ordinary skill in the art will understand that a variety of ferromagnetic materials can be used to form the magnetic core 240. For example, a material comprising a polymer magnet or magnetic particles mixed in a polymer can be deposited in the cavity 400. The magnetic material used to form the magnetic core 240 affects the inductance of the inductor 100 when it is fully fabricated. Thus, the particular magnetic material used to form the magnetic core 240 may advantageously be selected based on the desired inductance value.

In addition, those of ordinary skill in the art will understand that the ferromagnetic material can be deposited in the cavity 400 using a variety of suitable processes. For example, the ferromagnetic material can be cast or spin coated to fill the cavity 400. Alternatively, the ferromagnetic material can be deposited in the cavity 400 using well-known chemical vapor deposition (CVD), evaporation, sputtering, laser ablation, or electrochemical deposition processes. The particular process used to deposit the ferromagnetic material in the cavity 400 may advantageously be selected based upon available deposition equipment.

In one embodiment, the ferromagnetic material comprises micromachinable magnetic polymer composites, which are deposited in the cavity 400 using commercial polyimide (Dupont PI-2555) and ferrite magnetic powders.

In another embodiment, the ferromagnetic material comprises polymer-bound iron particle core, which is deposited in the cavity 400 by mixing spherical iron particles having a size in the range of about 6 $\mu$m to about 10 $\mu$m with 2%

(by weight) of soluble imide. The mixture is compression molded at a temperature of about 300° C. and at a pressure of about 131 megaPascals (MPa). The mixture can be annealed at a temperature of about 960° C. for a time period of about 6 hours to advantageously enhance the permeability in low field region.

In another embodiment, the ferromagnetic material comprises monolayer and multilayer ultrathin films composed of nanosized iron oxide ($Fe_3O_4$) particles and polyimide molecules, which are deposited in the cavity 400 using a layer-by-layer electrostatic self-assembly process. The substrate is first dipped into an aqueous solution of an anionic polyimide precursor (polyamic acid salt, PAATEA), and then dipped into an aqueous of polucation polydiallydimethylammonium chloride (PDDA) which coats on the nanoscale $Fe_3O_4$ as a stabilizer.

In another embodiment, the ferromagnetic material comprises a composite of Fe—Co with a copolymer of aniline formaldehyde, which is deposited in the cavity 400 using chemical processing.

In another embodiment, the ferromagnetic material comprises thin films consisting of granular dispersions of cobalt nano-particles in a hydrocarbon matrix, which are deposited in the cavity 400 by the sputtering of cobalt and the polymerization of hydrocarbon. The process involves the simultaneous sputtering of cobalt and plasma-induced polymerization of hydrocarbon monomers. The cobalt nanoparticles advantageously exhibit a hexagonal close-packed (hcp) structure and are uniformly distributed throughout the amorphous hydrocarbon matrix.

In another embodiment, the ferromagnetic material comprises a polymer magnetic composite (PMC) composed of ferrite powder, polymer, and solvent.

In another embodiment, the ferromagnetic material comprises a composite material consisting of a thermoplastic elastomer incorporated with iron powder and nickel-iron alloy powder.

In another embodiment, the ferromagnetic material comprises a composite of polyaniline (PANI), which is deposited in the cavity 400 using a chemical method. The saturation magnetization of the material advantageously increases as the reaction temperature and the concentration of $FeSO_4$ solution increases.

In another embodiment, the ferromagnetic material comprises ferromagnetic particle composite (FPC) films, which are deposited in the cavity 400 using a conventional spin-coating method. The FPC films are composed of polymers in which very fine ferromagnetic particles are homogeneously dispersed.

By depositing the ferromagnetic material in the cavity 400 using one of the processes discussed above or using any other suitable process, the magnetic core 240 is formed. Because the formation of the magnetic core 240 using this method involves low temperature materials, this method is particularly advantageous for low-temperature packaging of laminated printed circuit boards and silicon interposers. Those of ordinary skill in the art will understand that interposers are used for mounting semiconductor devices on circuit boards. After the magnetic core 240 is formed, the top surface 120 of the substrate 110 is preferably micromachined to provide a smooth surface.

Figure 8A:
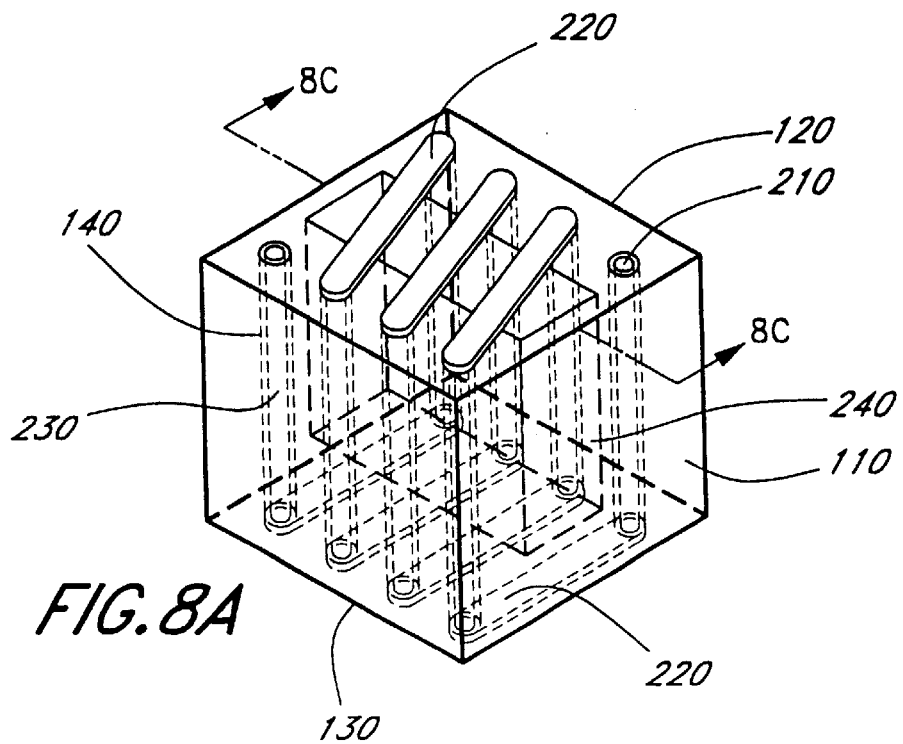
FIGS. 8A–8C illustrate the substrate of FIGS. 7A–7C after the paths have been filled with a conductive material and interconnected to form a conductive coil.
Figure 8B:
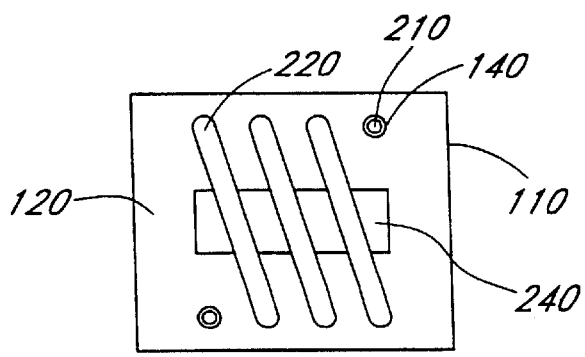

FIG. 8A illustrates an isometric view of the substrate 110 shown in FIGS. 7A–7C after the conductive posts 210 and the conductive segments 220 have been fabricated and interconnected to form the conductive coil 230. FIG. 8B illustrates a top view of the substrate 110 shown in FIG. 8A.

Figure 8C:
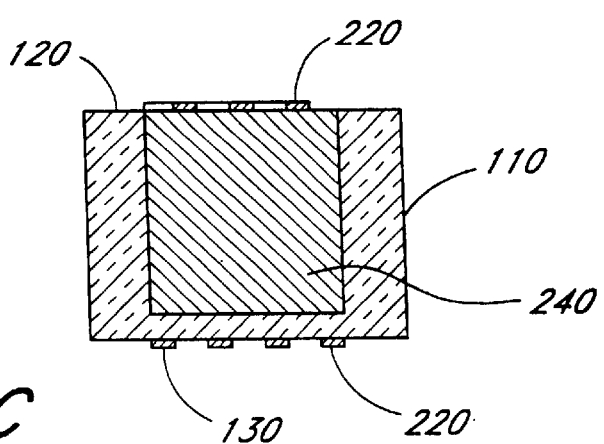

FIG. 8C illustrates a cross-sectional view of the substrate 110 along the line 8C—8C shown in FIG. 8A. As discussed above with respect to FIGS. 5A–5C, those of ordinary skill in the art will understand that the conductive posts 210 and the conductive segments 220 can be fabricated from a wide variety of suitable conductive materials, such as metals (e.g., aluminum, copper, gold, and the like), alloys, doped polysilicon, metal silicides, and the like. In general, materials having a higher conductivity are preferred to materials having a lower conductivity.

In one embodiment, the conductive material is used to fill or partially fill the paths 140 to form the plurality of conductive posts 210. In an alternative embodiment, the conductive coil 230 is partially diffused into the substrate 110.

In one embodiment, each conductive post 210 and conductive segment 220 is fabricated from a different conductive material. This configuration is particularly advantageous because the properties of the conductive coil 230 can be easily tuned through the selection of the various conductive materials. For example, the internal resistance of the conductive coil 230 can be increased by selecting a material having a higher resistance for a particular conductive segment 220 than the average resistance in the rest of the conductive coil 230.

In another embodiment, two different conductive materials are selected for fabricating the conductive coil 230. In this embodiment, materials are selected based on their compatibility with the available integrated circuit manufacturing processes. For example, if it is difficult to create a barrier layer where the conductive coil 230 pierces the substrate 110, then the conductive posts 210 that pierce the substrate 110 can be fabricated from aluminum. On the other hand, if it is relatively easy to create a barrier layer for the conductive segments 220 that interconnect the conductive posts 210, then copper can be used for the conductive segments 220.

Figure 9A:
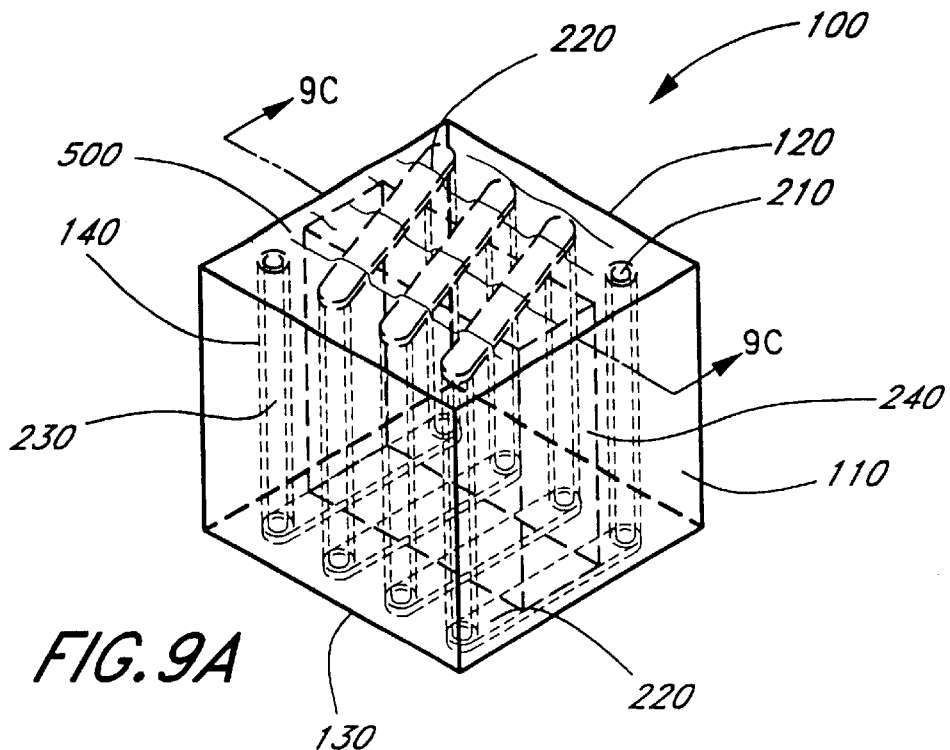
FIGS. 9A–9C illustrate an embodiment of an inductor in accordance with the present invention after the formation of two passivation layers around the inductor.
Figure 9B:
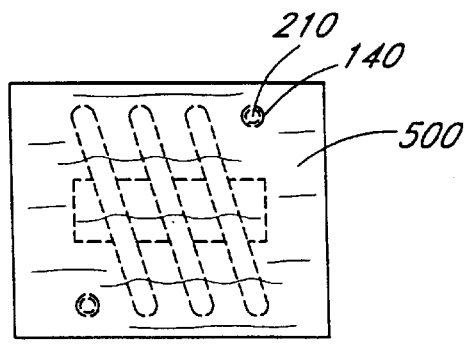
Figure 9C:
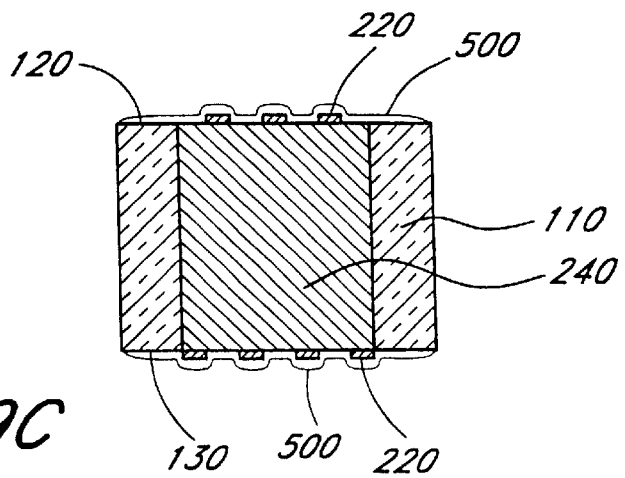

FIG. 9A illustrates an isometric view of an inductor 100 in accordance with the present invention after the formation of two passivation layers 500 around the conductive coil 230. FIG. 9B illustrates a top view of the inductor 100 shown in FIG. 9A. FIG. 9C illustrates a cross-sectional view of the inductor 100 along the line 9C—9C shown in FIG. 9A. As illustrated, the passivation layers 500 are formed on the top surface 120 and on the bottom surface 130 of the substrate 110. The passivation layers 500 advantageously protect the exposed portions of the conductive coil 230 from moisture, contamination, and physical damage. In addition, the passivation layers 500 electrically isolate the conductive coil 230 from any conducting layers deposited above the conductive coil 230.

Those of ordinary skill in the art will understand that the passivation layers 500 may comprise a variety of suitable nonconductive materials. The particular material for the passivation layers 500 can advantageously be selected based upon the thermal budget requirement. For low-temperature processing, for example, the passivation layers 500 may comprise polymers such as Parylene and polyimide. For ordinary processing at high temperature, on the other hand, the passivation layers 500 may comprise inorganic oxide such as silicon dioxide, nitride, or the combination of these.

Figure 10:
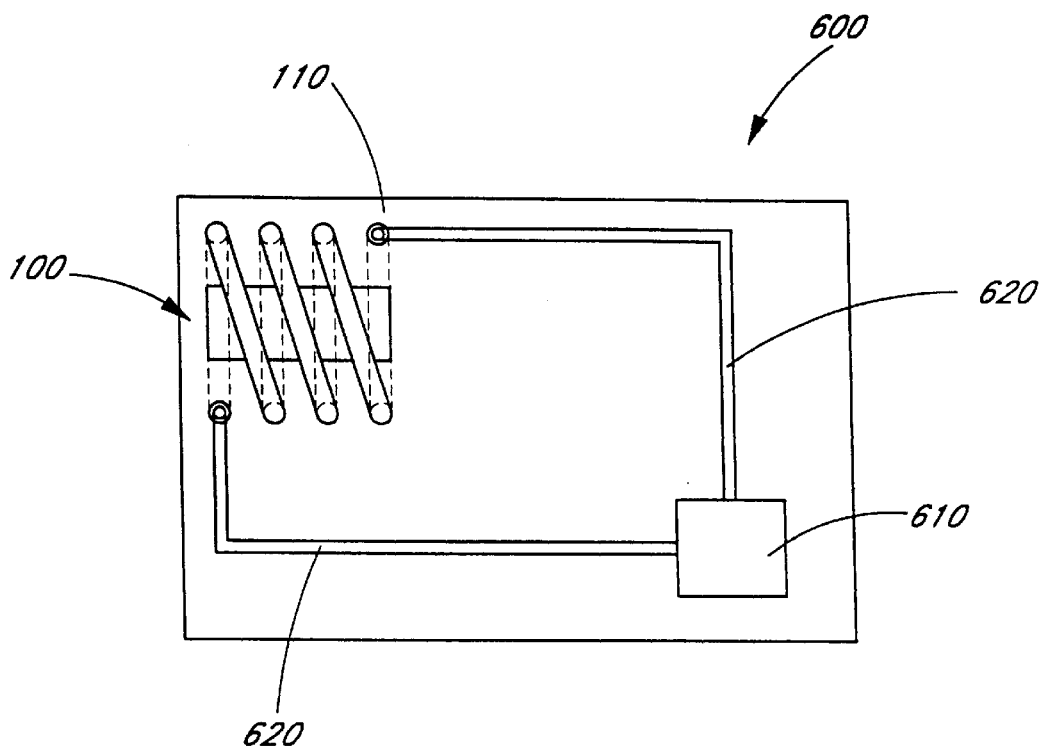
FIG. 10 illustrates a top view of an embodiment of an inductor-coupled circuit in accordance with the present invention.

FIG. 10 illustrates a top view of one embodiment of an inductor-coupled circuit 600 in accordance with the present invention. The inductor-coupled circuit 600 comprises an inductor 100 and a circuit 610 formed on a substrate 110. Those of ordinary skill in the art will understand that the circuit 610 can comprise a wide variety of suitable electronic circuits. In one embodiment, for example, the circuit 610 comprises a plurality of memory cells. The inductor 100 can be fabricated using any of the processes described above or using any other suitable process. The inductor 100 is electrically coupled to the circuit 610 by a plurality of conductive paths 620 formed on the substrate 110. Those of ordinary skill in the art will understand that the conductive paths 620 can be formed from a variety of conductive materials and using any of variety of well-known methods.

Figure 11:
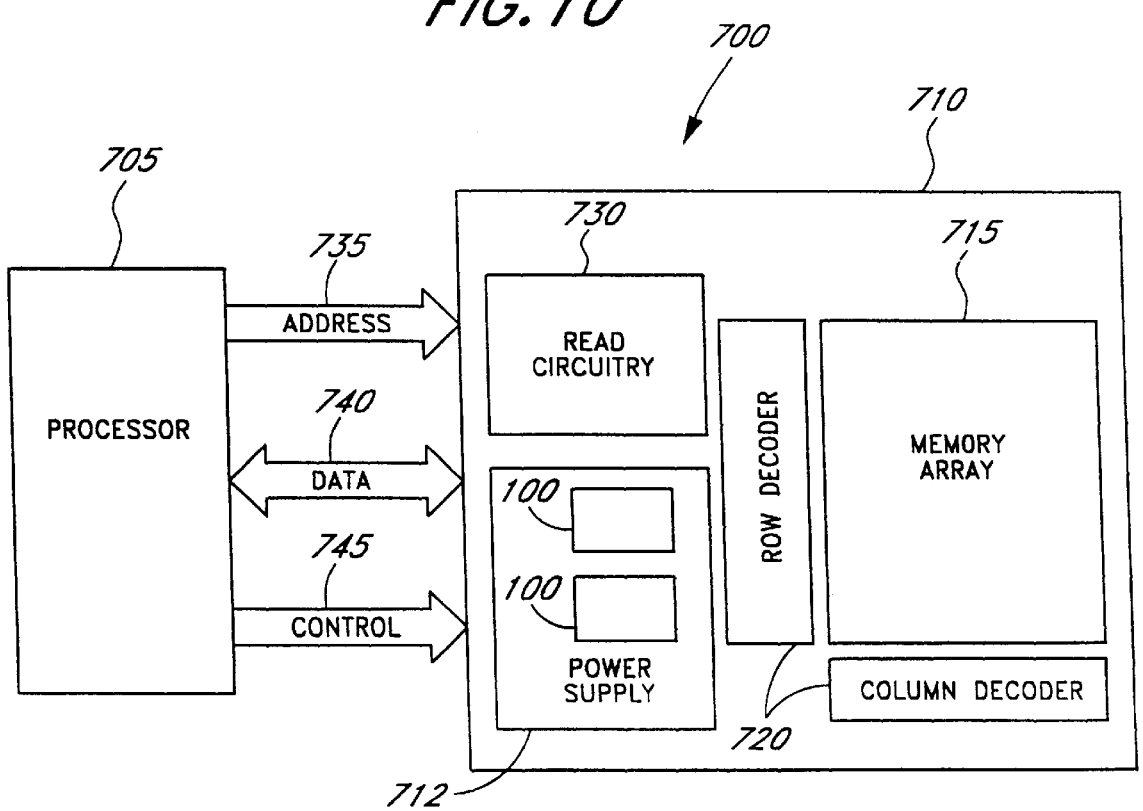
FIG. 11 illustrates a block diagram of a system level embodiment of the present invention.

FIG. 11 illustrates a block diagram of a system level embodiment of the present invention. A system 700 comprises a processor 705 and a memory device 710, which includes memory circuits and cells, electronic circuits, electronic devices, and a power supply circuit 712 coupled to a plurality of inductors 100 of one or more of the types described above. The memory device 710 comprises a memory array 715, address circuitry 720, and read circuitry 730. Furthermore, the memory device 710 is coupled to the processor 705 by an address bus 735, a data bus 740, and a control bus 745.

The processor 705, through the address bus 735, the data bus 740, and the control bus 745, communicates with the memory device 710. In a read operation initiated by the processor 705, address information, data information, and control information are provided to the memory device 710 through the address bus 735, the data bus 740, and the control bus 745, respectively. This information is decoded by addressing circuitry 720, which includes a row decoder and a column decoder, and read circuitry 730. Successful completion of the read operation results in information from the memory array 715 being communicated to the processor 705 over the data bus 740.

Although the foregoing has been a description and illustration of specific embodiments of the invention, various modifications and changes can be made thereto by persons skilled in the art, without departing from the scope and spirit of the invention as defined by the following claims.

What is claimed is:

1. An inductor comprising:

a substrate;

a magnetic core embedded within said substrate; and a three-dimensional conductive coil comprising a plurality of conductive posts interconnected by a plurality of conductive segments, wherein said conductive coil surrounds said magnetic core, and wherein said magnetic core comprises a porous region of said substrate having a ferromagnetic material deposited therein.

2. The inductor of claim 1, wherein said substrate comprises silicon carbide.

3. The inductor of claim 1, wherein each of said plurality of conductive posts and said plurality of conductive segments is fabricated from a different conductive material.

4. The inductor of claim 1, wherein each of said plurality of conductive posts and said plurality of conductive segments is fabricated from one of two different metals.

5. A method of fabricating an inductor embedded in a substrate, said method comprising the steps of:

forming a plurality of paths extending through said substrate;

forming a magnetic core in said substrate;

depositing a conductive material in said paths to form a plurality of conductive posts; and fabricating a plurality of conductive segments that interconnect said conductive posts to form a conductive coil, wherein said step of forming a magnetic core comprises:
   forming a porous region in said substrate; and
   depositing a ferromagnetic material in said porous region.

6. The method of claim 5, wherein said step of forming a plurality of paths comprises forming two substantially parallel rows of paths extending through said substrate.

7. The method of claim 5, wherein said step of forming a plurality of paths comprises using an etching process.

8. The method of claim 5, wherein said step of forming a plurality of paths comprises using a laser.

9. The method of claim 5, wherein said step of forming a plurality of paths comprises using a drill.

10. The method of claim 5, wherein said step of forming a magnetic core comprises forming a magnetic core in a region of said substrate bounded by said plurality of paths.

11. The method of claim 5, wherein said step of forming a porous region comprises using an anodic etching process.

12. The method of claim 5, wherein said step of forming a porous region comprises using a laser ablation process.

13. The method of claim 5, wherein said step of depositing a ferromagnetic material comprises depositing Permalloy.

14. The method of claim 5, wherein said step of depositing a ferromagnetic material comprises using a chemical vapor deposition process.

15. The method of claim 5, wherein said step of depositing a conductive material in said paths comprises one of filling or lining said paths with said conductive material.

* * * * *